United States Patent [19]

Shah et al.

[11] Patent Number: 4,723,228
[45] Date of Patent: Feb. 2, 1988

[54] MEMORY DECODING CIRCUIT

[75] Inventors: Ashwin H. Shah; James D. Gallia; Shivaling S. Mahant-Shetti, all of Dallas, Tex.

[73] Assignee: Texas Instruments Incorporated, Dallas, Tex.

[21] Appl. No.: 528,205

[22] Filed: Aug. 31, 1983

[51] Int. Cl.$^4$ ............................................. G11C 8/00
[52] U.S. Cl. .................................. 365/230; 365/189
[58] Field of Search ............................. 365/189, 230

[56] References Cited

U.S. PATENT DOCUMENTS

| | | | |
|---|---|---|---|
| 4,125,878 | 11/1978 | Watanabe | 365/208 |
| 4,386,420 | 5/1983 | Ong | 365/208 |
| 4,653,023 | 3/1987 | Suzuki et al. | 365/104 |
| 4,656,610 | 4/1987 | Yoshida et al. | 365/200 |

OTHER PUBLICATIONS

IEEE Journal of Solid-State Circuits—Vol. SC-17, No. 5, Oct. 1982, pp. 863-871.

Primary Examiner—James W. Moffitt
Attorney, Agent, or Firm—Rodney M. Anderson; Leo N. Heiting; Melvin Sharp

[57] ABSTRACT

Column decoding is performed using multiply decoded subsets of column address bits bussed across the array to multiple first stage and second stage column multiplexers. That is, for example, in an 8k by 9 memory wherein each subarray contains 16 selectable columns at each bit position, two of the address bits would be fully decoded to provide four buss lines across the chip. Each column has a primary sense amplifier, controlled by one of these four decoded lines. The outputs of each set of four primary sense amplifiers are multiplexed into a secondary sense amplifier, (preferably on a local three-scale buss) and the output of each secondary sense amplifier is selected or deselected by four buss lines which are the decoded signals corresponding to the other two address bits which select one of 16 columns. Preferably multiplexing of the output of the secondary sense amplifiers is accomplished by a three-state buffer, so that the output of these buffers can be accomplished as a wired-or function.

7 Claims, 4 Drawing Figures

MEMORY DECODING CIRCUIT

BACKGROUND AND SUMMARY OF THE INVENTION

The present invention relates to semiconductor memories. In particular, the present invention relates to static random access memories (SRAM) and dynamic random access memories (DRAM).

The conventional method for column address decoding is to provide column decoders spread all the way across the chip. That is, where a subarray has 128 columns, 7 buss lines will typically be provided to carry the corresponding address bits across the chip, and a separate decoder, connected to the 7 buss lines, will be provided for each column. This is adequately fast, but occupies a tremendous amount of space with this plethora of column decoders.

Thus it is an object of the present invention to provide a semiconductor memory wherein less space is required for routing of the column address lines and for column address logic.

A further difficulty with the prior art is that the column address decoders expand the total area of the chip. That is, these are not included in waste space, but lengthen one dimension of the chip, and therefore require more chip area. This leads to higher cost and lower yield, as is well known to those skilled in the art.

Thus it is an object of the present invention to provide a semiconductor random access memory wherein the column address decoding function requires only a minimal amount of extra chip area.

This prior art problem has been particularly obstreperous in the area of static random access memories (SRAMs). Typically these are very high speed memories in which the column pitch is somewhat larger than the column pitch for DRAM memories at comparable stages of the art. The availability of this extra pitch and the requirement of higher speed has made it particularly tempting for designers to use per-column decode all across the chip. However, increase in total chip area is as disastrous to cost and yield in the SRAM art as in the DRAM art.

Thus it is an object of the present invention to provide an SRAM having a column address decode implementation which only minimaly increases the total area of the chip.

It is further object of the present invention to provide a static random access memory having an address decode function implementation which only minimaly increases the total area of the chip, and which does not slow down the speed of the chip.

The difficulty in getting around the per-column decoding implementation of the prior art is that, if the column lines were decoded at the edge of the array, an immense amount of space would be wasted in buss lines. For example, to run 128 buss lines across the edge of a 128 column array would consume a large fraction of the total area of the array. Thus, while it would be desirable to save the huge fraction of chip area which is typically wasted on per-column decoders, it is also desirable not to waste too much chip area on buss lines.

Thus it is an object of the invention to provide a random access memory wherein the total chip area devoted to the column address decoding function, including both logic and buss lines, is minimized.

To accomplish these and other objects, the present invention teaches a column address decoding configuration in which subsets of the column bits are individually decoded. That is, for example, the two least significant bits are separately decoded to provide four buss lines, each of which controls every fourth primary sense amplifier. To each set of four primary sense amplifiers is connected one secondary sense amplifier, and the appropriate secondary sense amplifier is multiplexed onto the output lines by the remainder of the address bits.

Thus, the present invention is the first to teach *double multiplexing* of sense amplifiers. Multiple primary sense amplifiers are multiplexed together to provide input to each secondary sense amplifier, and multiple secondary sense amplifiers are multiplexed onto the data buss.

The multiplexing referred to is functional multplexing. That is, a conventional multiplex switch matrix may be used, or three state buffers may be connected to a local buss to provide the multiplexing function.

This multiplexing need not be performed in only two stages. For example, to address 64 columns in a subarray, 6 buss lines would be needed with per-column decoders, but, if 12 buss lines are used, three cascaded multiplexing stages according to the present invention can be used instead of the per-column decoder.

A further embodiment of the present invention is the provision of full-decoding for the final sense amplifier, in combination with primary sense amplifiers addressed by the decoded extension of the least significant bits connected to each secondary sense amplifier. That is, for example, a 256-column memory array (8 column address bits), the least significant bits AY0 and AY1 will be separately decoded at the edge of the array into four lines, namely AY0 and AY1, AY0 and not AY1, not AY0 and AY1, and not AY0 and not AY1. For each set of four adjacent columns, the four primary sense amplifiers would each be controlled by exactly one of these four lines. All four primary sense amplifier in each set would be connected to a secondary sense amplifier (one secondary sense amplifier for every four columns). Each secondary sense amplifier could be accessed by a further subset of the decoded address lines, e.g. by lines decoding the states of AY2 and AY3. The remaining four address bits (AY4 thru AY7) could then be used to access decoders spaced across the array but only one of these decoders would be required for every 16 columns. Thus, the total required number of buss lines would be 12 instead 8, and substantial space would be saved on the column decode logic without degrading speed. Alternatively, a full decoder could be used for each 4 or each 8 primary sense amplifiers, to jointly minimize wiring area and logic area.

According to the present invention there is provided:

a random access memory comprising:

an array of memory cells arranged in rows and columns, a plurality of primary sense amplifiers, each of said columns of said memory cells of said array being connected to exactly one of said primary sense amplifiers, column Address decoding means, for receiving column address bits and driving first address lines in correspondence with dec oded values of a first subset of said address bits and driving second address lines in correspondence with decoded values of a second subset of said address bits;

a plurality of secondary sense amplifiers, each of said secondary sense amplifiers having an input connected to the outputs of a plurality of primary sense amplifiers, all of said primary sense amplifiers which are connected to a particular one of said secondary sense amplifiers also severally being selectively scheduled by a respective different ones of said first address lines;

said secondary sense amplifier each being selectively activated by exactly one of said second address lines;

at least one output means, connected to said secondary sense amplifiers for providing an output corresponding to the one of said secondary sense amplifiers which has been activated by said second address lines.

According to the present invention there is provided: A random access memory comprising:

an array of memory cells are arranged in rows in columns;

a parality of primary sense amplifiers, each of said primary said amplifiers being connected to one of said columns of said array;

a column addressed decoder, connected to receive a purility column addressed bit and to drive a first said decoder addressed line in correspondence with only a partical subset of said column addressed bits;

a purality of secondary sense amplifiers, each of said secondary sense amplifiers having an input connected to a purality of said primary sense amplifiers, all of said primary sense amplifiers which are connected to each one of said secondary sense amplifiers also severally being selectively activated by respective different ones of said first addressed lines;

said secondary sense amplifiers each being connected to receive signals corresponding to a plurality of said addressed bits of which are not decoded on said first addressed line, said secondary amplifiers each providing an output selectively in accordance with said other addressed bits.

BRIEF DESCRIPTION OF THE DRAWINGS

The present invention will be described with reference to the accompaning drawings, wherein.

DESCRIPTION OF THE PREFERRED EMBODIMENTS

The present invention teaches a improved column address decoding scheme, wherein the total area required for decoding logic and routing of address lines is minimized.

The present invention is particulary advantageous with regard to memories which are more than one bit wide, i.e. to memories wherein at least one subarray contains more than one bit position, and different bits of data are outputted from each bit position when accessed. In such a memory, the number of columns to be selected from will be smaller than the number of columns in the whole array by a factor which is equal to the number of bit positions in the whole array, and therefore the number of column address bits to be decoded will be reduced accordingly. However, the present invention is applicable to any semiconductor memory.

Figure 1:
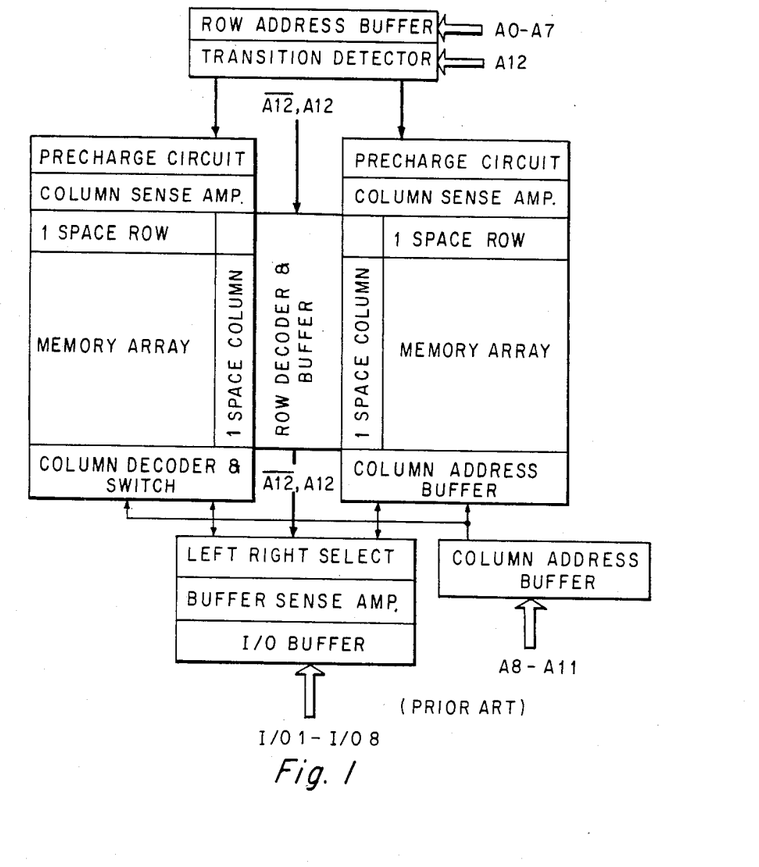
FIG. 1 schematically shows a sample prior art implementation of address decoding for a semiconductor memory array.
Figure 2:
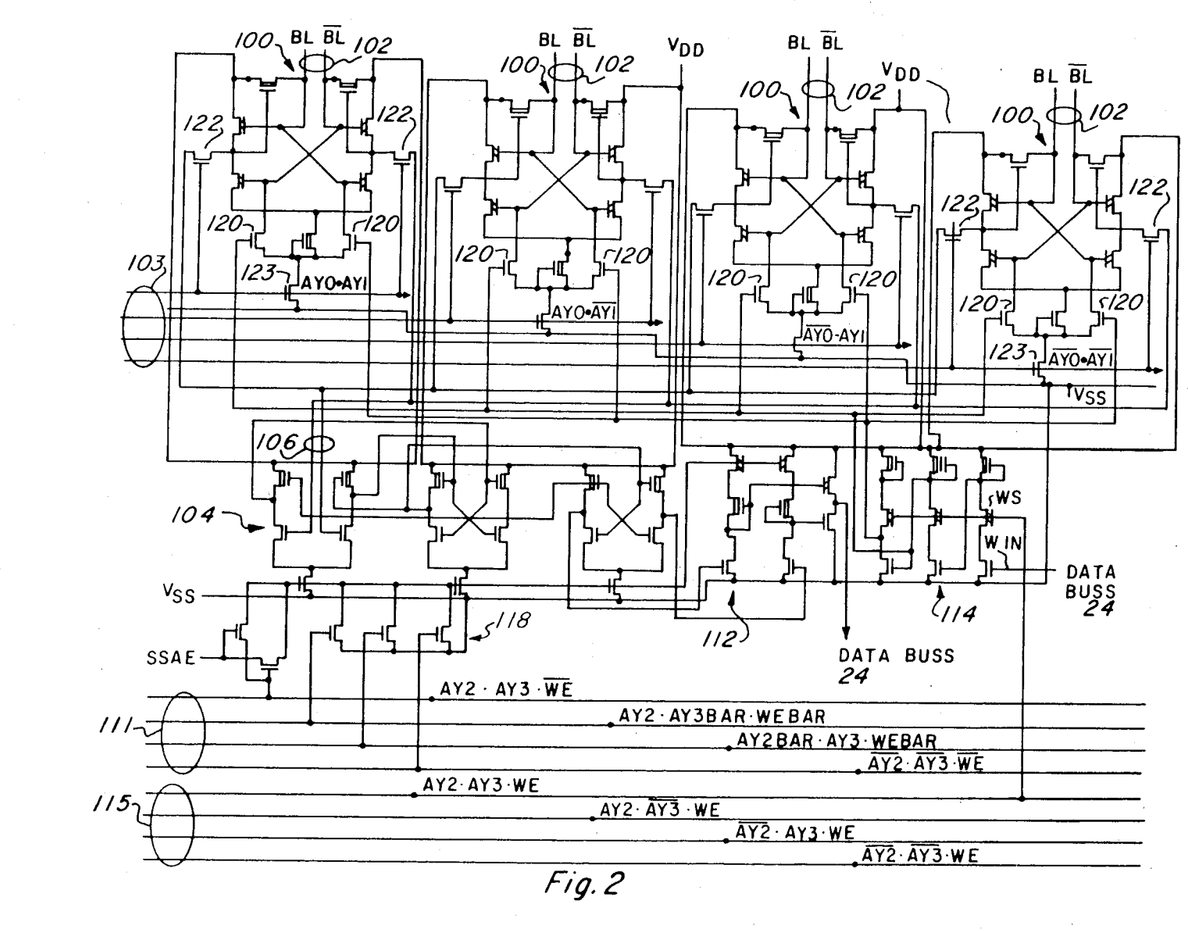
FIG. 2 schematically shows doubly multiplexed column sense amplifiers according to the present invention.

FIG. 2 shows schematically the presently preferred embodiment. Note that in this embodiment 12 buss lines (103, 111, 115) are provided, although only 8 are strictly required. This is because the write enable signal is separately decoded. That is, the write bit is in effect decoded together with the two most significant bits, so that 8 lines carry this decoded combination. This optional implementation feature provides power down on the read logic in each secondary sense amplifier when the write logic is powered up (and vice versa), minimizing total power consumption. It should be noted that this is done in connection with a data buss architecture wherein the rear data buss lines are separated from the write data buss lines. If this were not so, the read logic in the secondary sense amplifier would not be as separate from the write logic, and the full decoding of the write bit in combination with the most significant column address bits would not be as desirable.

Figure 3:
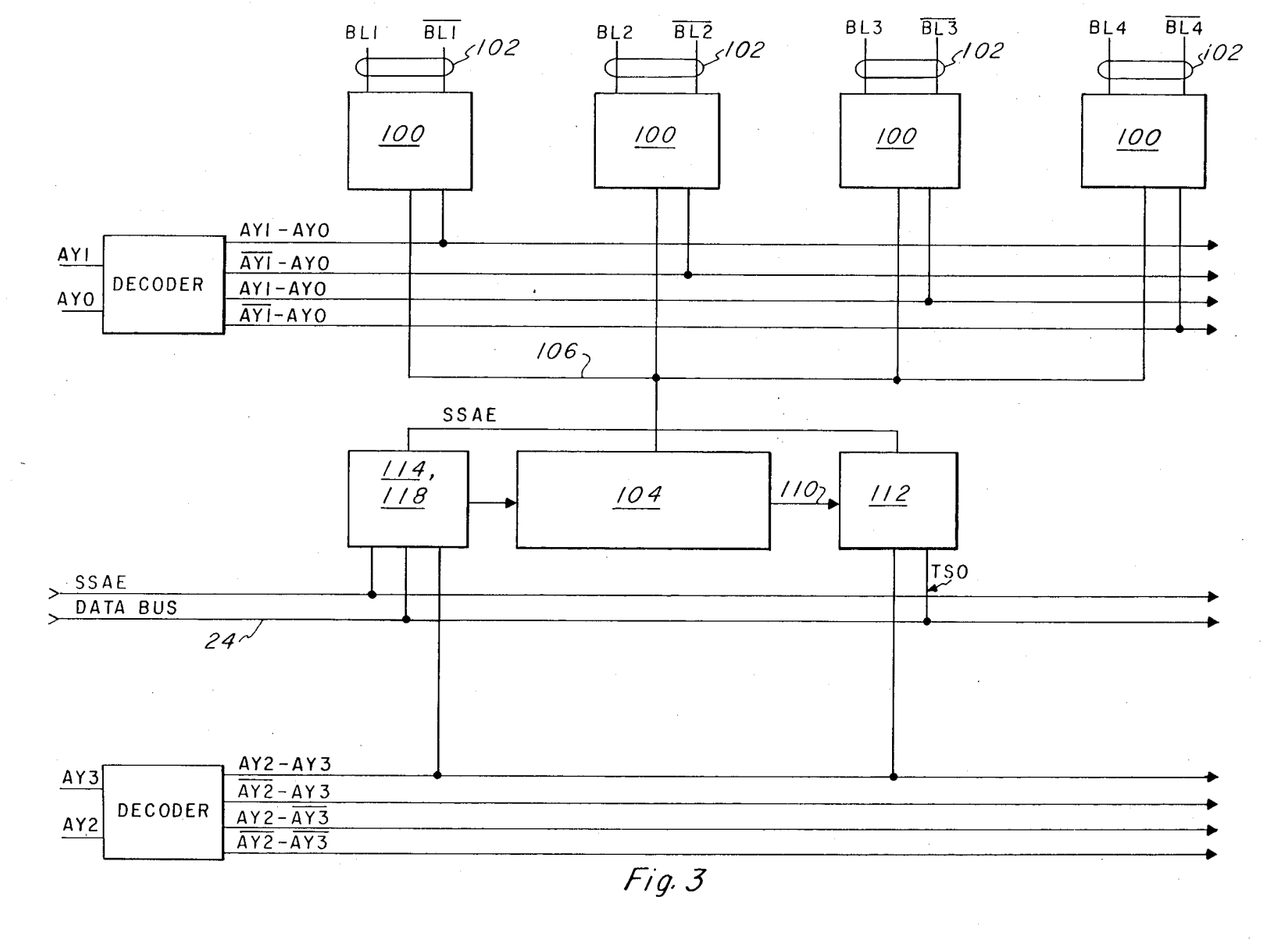
FIG. 3 shows a simplified block diagram of the embodiment shown in the schematic diagram of FIG. 2.

FIG. 3 shows a detailed implementation of the presently preferred embodiment.

Figure 4:
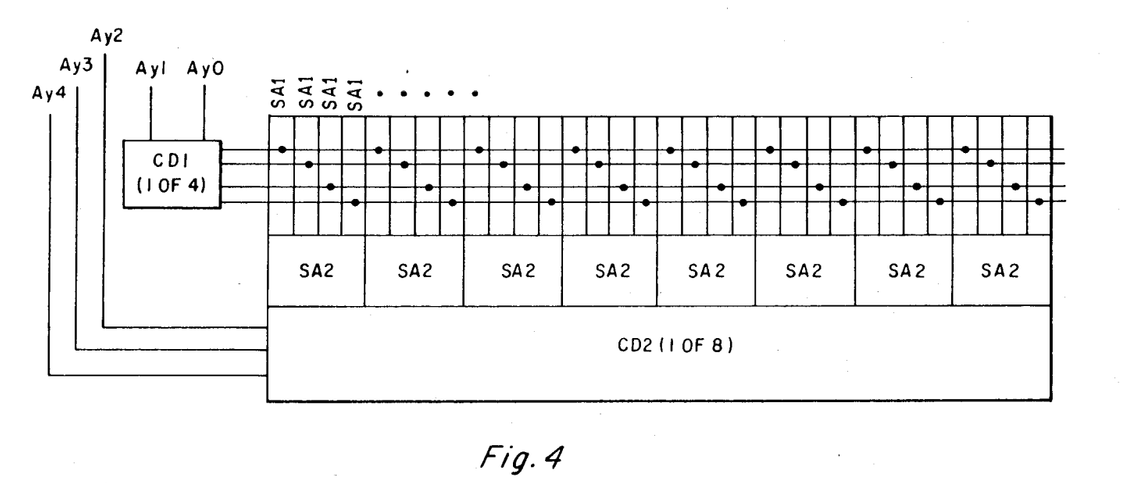
FIG. 4 shows a further embodiment of the invention, wherein the two most significant column address bits are separately decoded at the subarray level and the remaining column address bits for each subarray are only locally decoded.

FIG. 4 shows a portion of the sense amplifier structure used for each bit position in the presently preferred embodiment. The circuit portion shown contains four primary sense amplifiers 100 each of which is connected to a bit line pair 102. (Each bit line pair is connected to 256 conventional static random access memory cells addressed by 256 respective polysilicon wordlines.) Two of the column address lines are decoded to provide four address lines which select one of these four primary sense amplifiers 100 to be connected to the secondary sense amplifier 104. These address busses are shown by the designations AY0 AND AY1, AY0 AND AY1BAR, AY0BAR AND AY1, and AY0BAR AND AY1BAR. Preferably each primary sense amplifier contains a three-state buffer connected to the local buss 106. The signal from the thus selected one of the primary sense amplifiers 100 is applied on the pair of lines 106 to the first amplification stage of secondary sense amplifier 104. The outputs 110 of these amplifiers are applied to a power down buffer 112 which provides a three-state output signal TSO directly to the readline which corresponds to this particular bit position in the data buss 24.

Thus, if the address bits AY2 and AY3 indicate that the accessed column is among the four columns which are connected to this paricular secondary sense amplifier 104, and if the SAD line which is connected to all of the four secondary sense amplifiers 104 (one of the four amplifiers as shown in FIG. 3) at this particular bit position has not been pulled low, the enable block 118 will provide a high signal on the "power down" line ssae shown. This signal not only enables the enable block 118, but also supplies the power down signal to the power down buffer 112. When the same signal is high, the power down buffer 112 simply operates as a buffer, and the output TSO simply provides an output signal corrsponding to the signal held on the particular bit line pair 102 which has been selected by the address bits AY0 and AY1. However, when the power down signal ssae goes low, the output TSO of the power down buffer 112 is in a high-impedance floating condition. Thus all four of the secondary sense amplifiers 104 at each bit position can simply be connected in parallel to the appropriate bit position line in the data buss 24, since only one (at most) of thes secondary sense amplifiers 104 will be providing a strongly driven signal at its output node TSO, and the other three secondary sense amplifiers 104 (or possibly all four of these secondary sense amplifiers 104) will hold their outputs TSO in a floating condition, due to the operation of power down buffer 112.

Referring back to FIG. 2, the write buffer 114 contains a line WIN which is directly wired to the line on the right portion of the data buss 24 which corresponds to this particular bit position, and the write buffer also contains a select gate WS which is hard wired to one of the four write address busses, which contains decoded address bits AY2 and AY3 ANDed with the write enable signal WE. These four lines are labeled: WE AND AY2 AND AY3; WE AND AY2 AND AY3bar; WE AND AY2bar AND AY3; and WE AND AY2bar AND AY3bar. The complementary outputs of the write buffer 114 are applied to a pair of write transistors 120 in each primary sense amplifier 100. The pass transistors 122 and the pull down transistor 123 and one of the primary sense amplifiers 100 will have been opened by the decoded combination of column address bits AY0 and AY1 as discussed above. Thus, in this selected primary sense amplifier 100, one of the bit lines 102 will be pulled down strongly and information corresponding to the write input data WIN will be held onto the bit lines 10 to be written into which ever of the memory cells is accessed by one of the 256 wordlines. In the other three primary sense amplifiers 100 at this secondry sense amplifier position, the pull down transistor 123 will not have been turned on, and the write transistors 120 will therefore have no effect.

In a memory which is only one bit wide, a key teaching of the present invention is multiple multiplexing stages in the sense amplifier. For example, decoding of the four least significant column address bits could be handled as discussed above, and the remainder of the column address bits could be decoded by one decoder for every 16 columns. Such a configuration is shown schematically in FIG. 4.

Thus the present invention provides a generally new innovation in column address decoding, which is particularly applicable to and advantageous in SRAMs, but is also applicable to other types of semiconductor memories. The scope of the present invention is not limited except as specified in the accompanying Claims.

What is claimed is:

1. A random access memory comprising:
   an array of memory cells arranged in rows and columns;
   a column address decoder for receiving a column address signal, said decoder providing first and second output signals in response to said column address signal;
   a plurality of primary sense amplifiers, each of said columns of said memory cells of said array being connected to one of said primary sense amplifiers, said primary sense amplifiers being grouped in a plurality of subsets of said plurality of primary sense amplifiers, one of said primary sense amplifiers in each subset of said plurality of subsets of said plurality of primary sense amplifiers being selectively activated in response to said first output signal; and
   a plurality of secondary sense amplifiers, each of said secondary sense amplifiers having an input connected to the outputs of one of said primary sense amplifiers from each of said subsets of said plurality of primary sense amplifiers, said secondary sense amplifiers being selectively activated in response to said second output signal, said plurality of secondary sense amplifiers providing a data output signal in response to the signal sensed by the selected primary and secondary sense amplifiers.

2. The memory of claim 1, wherein said plurality of secondary sense amplifiers provide a plurality of data output signals, each of said data output signals corresponding to a binary data bit in a binary data word.

3. The memory of claim 1, wherein each secondary sense amplifier includes a three-state output buffer which is in a high impedance condition when said secondary sense amplifier is not activated.

4. The memory of claim 2, wherein each secondary sense amplifier includes a three-state output buffer which is in a high impedance condition when said secondary sense amplifier is not activated.

5. The memory of claim 3 wherein the output signal provided by said output buffers is provided on an output bus electrically connected to said output buffers of said plurality of secondary sense amplifiers.

6. A random access memory comprising:
   an array of memory cells are arranged in rows in columns;
   a plurality of primary sense amplifiers, each of said primary sense amplifiers being connected to one of said columns of said array: said plurality of primary sense amplifiers being grouped into subsets;
   a column address decoder, connected to receive a column address word and to drive first and second decode address lines in correspondence with a partial subset of said column address words and
   a plurality of secondary sense amplifiers, each of said secondary sense amplifiers having an input connected to one of said primary sense amplifiers from each of said subsets of said plurality of primary sense amplifiers, one of said primary sense amplifiers in each of said subsets of said plurality of primary sense amplifiers being selectively activated by signals provided on said first decode lines;
   said secondary sense amplifiers each being connected to said second decode lines and said secondary amplifiers each providing an output selectively in accordance with signals provided on said second decode lines.

7. A random access memory comprising:
   an array of memory cells are arranged in rows and columns:
   a plurality of primary sense amplifiers, each of said primary said amplifiers being connected to one of said columns of said array and said plurality of primary sense amplifiers being arranged in subsets;
   a first and second column address decoders, connected to receive a column address word and to drive first and second address lines, respectively, in correspondence with a partial subset of said column address word; and
   a plurality of secondary sense amplifiers, each of said secondary sense amplifiers having an input connected to a subset of said primary sense amplifiers, one of said primary sense amplifiers in each of said subsets being selectively activated by signals provided on said first address lines;
   said secondary sense amplifiers each being connected to said second address decode lines and said secondary amplifiers each providing an output selectively in accordance with signals provided on said second address lines.

* * * * *

REEXAMINATION CERTIFICATE (3497th)

United States Patent [19]
Shah et al.

[11] B1 4,723,228
[45] Certificate Issued Apr. 21, 1998

[54] MEMORY DECODING CIRCUITRY

[75] Inventors: Ashwin H. Shah; James D. Gallia; Shivaling S. Mahant-Shetti, all of Dallas, Tex.

[73] Assignee: Texas Instruments Incorporated, Dallas, Tex.

Reexamination Request:
No. 90/004,534, Jan. 31, 1997

Reexamination Certificate for:
Patent No.: 4,723,228
Issued: Feb. 2, 1988
Appl. No.: 528,205
Filed: Aug. 31, 1983

[51] Int. Cl.$^6$ .................................................. G11C 8/00
[52] U.S. Cl. ........................ 365/230.06; 365/230.08; 365/230.02; 365/230.03
[58] Field of Search ..................... 365/230.06, 230.08, 365/230.01, 230.02, 230.03

[56] References Cited

U.S. PATENT DOCUMENTS

| | | | |
|---|---|---|---|
| 4,050,061 | 9/1977 | Kitagawa | 340/173 R |
| 4,104,733 | 8/1978 | Satoh | 365/189 |
| 4,114,192 | 9/1978 | Suzuki et al. | 365/189 |
| 4,125,878 | 11/1978 | Watanabe | 365/208 |
| 4,156,938 | 5/1979 | Proebsting et al. | 365/63 |
| 4,241,425 | 12/1980 | Cenker et al. | 365/222 |
| 4,309,627 | 1/1982 | Tabata | 307/362 |
| 4,321,489 | 3/1982 | Higuchi et al. | 307/362 |
| 4,386,420 | 5/1983 | Ong | 365/208 |
| 4,389,715 | 6/1983 | Eaton, Jr. et al. | 365/200 |
| 4,406,013 | 9/1983 | Reese et al. | 377/29 |
| 4,437,025 | 3/1984 | Liu et al. | 307/475 |
| 4,449,207 | 5/1984 | Kung et al. | 365/230 |
| 4,459,685 | 7/1984 | Sud et al. | 365/200 |
| 4,571,704 | 2/1986 | Bohac, Jr. | 365/156 |
| 4,590,588 | 5/1986 | Itoh et al. | 365/51 |
| 4,596,003 | 6/1986 | Shimizu | 365/189 |
| 4,611,131 | 9/1986 | Shah et al. | 307/449 |

(List continued on next page.)

FOREIGN PATENT DOCUMENTS

| | | | |
|---|---|---|---|
| 3-206709 | 9/1991 | Japan | H03K 17/22 |
| 5-122052 | 5/1993 | Japan | H03K 19/0185 |

OTHER PUBLICATIONS

Kuo et al., "16–k RAM built with proven process may offer high start–up reliability", *Electronics*, pp. 81–86, May 13, 1976.

"Design Analysis and Comparison of Silicon Gate 4K RAMs", *MOSAID Inc.*, pp. 10–1 to 10–10, 1976 Ontario, Canada.

"An 8K×8 Dynamic RAM with Self–Refresh", Kung et al., *IEEE Journal of Solid–State Circuits*, vol. SC–17, No. 5, Oct. 1982, pp. 863–871.

U.S. application No. 08/386,704, Roohparvar, filed Feb. 10, 1995.

U.S. application No. 08/493,162, Roohparvar, filed Jun. 21, 1995.

U.S. application No. 08/508,864, Roohparvar et al., filed Jul. 28, 1995.

U.S. application No. 08/508,828, Roohparvar et al., filed Jul. 28, 1995.

*Primary Examiner*—Viet Q. Nguyen

[57] ABSTRACT

Column decoding is performed using multiply decoded subsets of column address bits bussed across the array to multiple first stage and second stage column multiplexers. That is, for example, in an 8K by 9 memory wherein each subarray contains 16 selectable columns at each bit position, two of the address bits would be fully decoded to provide four buss lines across the chip. Each column has a primary sense amplifier, controlled by one of these four decoded lines. The outputs of each set of four primary sense amplifiers are multiplexed into a secondary sense amplifier, (preferably on a local three-scale buss) and the output of each secondary sense amplifier is selected or deselected by four buss lines which are the decoded signals corresponding to the other two address bits which select one of 16 columns. Preferably multiplexing of the output of the secondary sense amplifiers is accomplished by a three-state buffer, so that the output of these buffers can be accomplished as a wired-or function.

U.S. PATENT DOCUMENTS

| | | | |
|---|---|---|---|
| 4,611,299 | 9/1986 | Hori et al. | 365/189 |
| 4,653,023 | 3/1987 | Suzuki et al. | 365/104 |
| 4,656,610 | 4/1987 | Yoshida et al. | 365/200 |
| 4,658,156 | 4/1987 | Hashimoto | 307/350 |
| 4,723,228 | 2/1988 | Shah et al. | 365/230 |
| 4,858,185 | 8/1989 | Kowshik et al. | 365/181 |
| 4,922,133 | 5/1990 | Iwahashi et al. | 307/363 |
| 5,031,142 | 7/1991 | Castro | 365/49 |
| 5,047,664 | 9/1991 | Moyal | 307/303 |
| 5,077,738 | 12/1991 | Larsen et al. | 371/15.1 |
| 5,083,045 | 1/1992 | Yim et al. | 307/350 |
| 5,097,146 | 3/1992 | Kowalski et al. | 307/350 |
| 5,118,968 | 6/1992 | Douglas et al. | 307/362 |
| 5,144,159 | 9/1992 | Frisch et al. | 307/272 |
| 5,214,316 | 5/1993 | Nagai | 307/272 |
| 5,247,479 | 9/1993 | Young | 365/189.05 |
| 5,262,990 | 11/1993 | Mills et al. | 365/189 |
| 5,278,458 | 1/1994 | Holland et al. | 307/272 |
| 5,280,198 | 1/1994 | Almulla | 307/296 |
| 5,311,470 | 5/1994 | Atsumi et al. | 365/189 |
| 5,317,532 | 5/1994 | Ochii | 365/149 |
| 5,378,936 | 1/1995 | Kokubo et al. | 327/77 |
| 5,469,100 | 11/1995 | Wuidart et al. | 327/262 |
| 5,526,364 | 6/1996 | Roohparvar | 371/22.1 |
| 5,532,970 | 7/1996 | Butler et al. | 365/230.05 |

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.
ONLY THOSE PARAGRAPHS OF THE SPECIFICATION AFFECTED BY AMENDMENT ARE PRINTED HEREIN.

Column 1, lines 44–47:

Thus it is an object of the present invention to provide an SRAM having a column address decode implementation which only [minimaly] *minimally* increases the total area of the chip.

Column 1, lines 48–52:

It is further object of the present invention to provide a static random access memory having an address decode function implementation which only [minimaly] *minimally* increases the total area of the chip, and which does not slow down the speed of the chip.

Column 2, lines 24–50.

A further embodiment of the present invention is the provision of full-decoding for the final sense amplifier, in combination with primary sense amplifiers addressed by the decoded extension of the least significant bits connected to each secondary sense amplifier. That is, for example, a 256-column memory array (8 column address bits), the least significant bits AY0 and AY1 will be separately decoded at the edge of the array into four lines, namely AY0 and AY1, AY0 and not AY1, not AY0 and AY1, and not AY0 and not AY1. For each set of four adjacent columns, the four primary sense amplifiers would each be controlled by exactly one of these four lines. All four primary sense amplifier in each set would be connected to a secondary sense amplifier (one sense amplifier for every four columns). Each secondary sense amplifier could be accessed by a further subset of the decoded address lines, e.g. by lines decoding the states of AY2 and AY3. The remaining four address bits (AY4 [thru] *through* AY7) could then be used to access decoders spaced across the array but only one of these decoders would be required for every 16 columns. Thus, the total required number of buss lines would be 12 instead 8, and substantial space would be saved on the column decode logic without degrading speed. Alternately, a full decoder could be used for each 4 or each 8 primary sense amplifiers, to jointly minimize wiring area and logic area.

Column 2, lines 59–64:

column Address decoding means, for receiving column address bits and driving first address lines in correspondence with [dec oded] *decoded* values of a first subset of said address bits and driving second address lines in correspondence with decoded values of a second subset of said address bits;

Column 3, lines 14–16:

a [parality] *plurality* of primary sense amplifiers, each of said primary said amplifiers being connected to one of said columns of said array;

Column 3, lines 17–20:

a column addressed decoder, connected to receive a [purility column addressed bit] *plurality of column address bits* and to drive a first said decoder addressed line in correspondence with only a [partical] *partial* subset of said column addressed bits;

Column 3, lines 21–27:

a [purality] *plurality* of secondary sense amplifiers, each of said secondary sense amplifiers having an input connected to a [purality] *plurality* of said primary sense amplifiers, all of said primary sense amplifiers which are connected to each one of said secondary sense amplifiers also severally being selectively activated by respective different ones of said first addressed lines;

Column 3, lines 37–38:

The present invention will be described with reference to the [accompaning] *accompanying* drawings, wherein;

Column 3, lines 58–Column 4, line 2:

The present invention is [particulary] *particularly* advantageous with regard to memories which are more than one bit wide, i.e. to memories wherein at least one subarray contains more than one bit position, and different bits of data are outputted from each bit position when accessed. In such a memory, the number of columns to be selected from will be smaller than the number of columns in the whole array by a factor which is equal to the number of bit positions in the whole array, and therefore the number of column address bits to be decoded will be reduced accordingly. However, the present invention is applicable to any semiconductor memory.

Column 4, lines 23–45:

FIG. 4 shows a portion of the sense amplifier structure used for each bit position in the presently preferred embodiment. The circuit portion shown contains four primary sense amplifiers 100 each of which is connected to a bit line pair 102. (Each bit line pair is connected to 256 conventional static random access memory cells addressed by 256 respective polysilicon wordlines.) Two of the column address lines are decoded to provide four address lines which select one of these four primary sense amplifiers 100 to be connected to the secondary sense amplifier 104. These address busses are shown by the designations AY0 AND AY1, AY0 AND AY1BAR, AY0BAR AND AY1, and AY0BAR AND AY1BAR. Preferably each primary sense amplifier contains a three-state buffer connected to the local buss 106. The signal from the thus selected one of the primary sense amplifiers 100 is applied on the pair of lines 106 to the first amplification stage of secondary sense amplifier 104. The outputs 110 of these amplifiers are applied to a power down buffer 112 which provides a three-state output signal TSO directly to the [readline] *read line* which corresponds to this particular bit position in the data buss 24.

Column 4, lines 46–Column 5, line 5:

Thus, if the address bits AY2 and AY3 indicate that the accessed column is among the four columns which are connected to this [paricular] *particular* secondary sense amplifier 104, and if the SAD line which is connected to all of the four secondary sense amplifiers 104 (one of the four amplifiers as shown in FIG. 3) at this particular bit position has not been pulled low, the enable block 118 will provide a high signal on the "power down" line ssae shown. This signal not only enables the enable block 118, but also supplies the power down signal to the power down buffer 112. When the same signal is high, the power down buffer 112 simply operates as a buffer, and the output TSO simply provides an output signal [corrsponding] *corresponding* to the signal held on the particular bit line pair 102 which has been selected by the address bits AY0 and AY1. However, when the power down signal ssae goes low, the output TSO of the power down buffer 112 is in a high-impedance floating condition. Thus all four of the secondary sense amplifiers 104 at each bit position can simply be connected in parallel to the appropriate bit position line in the data buss 24, since only one (at most) of [thes] *these* secondary sense amplifiers 104 will be providing a strongly driven signal at its output node TSO, and the other three secondary sense amplifiers 104 (or possibly all four of these secondary sense amplifiers 104) will hold their outputs TSO in a floating condition, due to the operation of power down buffer 112.

Column 5, lines 6-30:

Referring back to FIG. 2, the write buffer 114 contains a line WIN which is directly wired to the line on the right portion of the data buss 24 which corresponds to this particular bit position, and the write buffer also contains a select gate WS which is hard wired to one of the four write address busses, which contains decoded address bits AY2 and AY3 ANDed with the write enable signal WE. These four lines are labeled: WE AND AY2 AND AY3; WE AND AY2 AND AY3bar; WE AND AY2bar AND AY3; and WE AND AY2bar AND AY3bar. The complementary outputs of the write buffer 114 are applied to a pair of write transistors 120 in each primary sense amplifier 100. The pass transistors 122 and the pull down transistor 123 and one of the primary sense amplifiers 100 will have been opened by the decoded combination of column address bits AY0 and AY1 as discussed above. Thus, in this selected primary sense amplifier 100, one of the bit lines 102 will be pulled down strongly and information corresponding to the write input data WIN will be held onto the bit lines 10 to be written into which ever of the memory cells is accessed by one of the 256 wordlines. In the other three primary sense amplifiers 100 at this [secondry] *secondary* sense amplifier position, the pull down transistor 123 will not have been turned on, and the write transistors 120 will therefore have no effect.

THE DRAWING FIGURES HAVE BEEN CHANGED AS FOLLOWS:

FIG. 2 has been changed to add, Transistor (123) is coupled between each respective sense amplifier (100) and power supply ($V_{SS}$).

AS A RESULT OF REEXAMINATION, IT HAS BEEN DETERMINED THAT:

Claims 2 and 4 are cancelled.

Claims 1, 6 and 7 are determined to be patentable as amended.

Claims 3 and 5, dependent on an amended claim, are determined to be patentable.

New claims 8–50 and 51 are added and determined to be patentable.

1. A random access memory *having a plurality of bit positions for producing an external output signal which is more than one bit wide, the memory* comprising:

an array of memory cells arranged in rows and columns, *the array of memory cells being organized into the plurality of bit positions wherein each bit position includes a portion of the array of memory cells, each bit position for producing one bit of data to be output from the memory*;

a column address decoder for receiving a column address signal, said decoder providing first and second *decoder* output signals in response to said column address signal;

a plurality of primary sense amplifiers *for each bit position*, each of said columns of said memory cells of said array being connected to one of said primary sense amplifiers, said primary sense amplifiers being grouped in a plurality of subsets [of said plurality] of primary sense amplifiers, one of said primary sense amplifiers in each subset [of said plurality of subsets of said plurality of primary sense amplifiers] being selectively activated in response to said first *decoder* output signal; [and]

a plurality of secondary sense amplifiers *for each bit position*, each of said secondary sense amplifiers having an input connected to the outputs of [one of said primary sense amplifiers from] each *primary sense amplifier of a subset* of said subsets [of said plurality] of primary sense amplifiers, *one of* said secondary sense amplifiers *for each bit position* being selectively activated in response to said second *decoder* output signal, [said plurality of] *each of said selectively activated* secondary sense amplifiers providing a data output signal in response to [the] *a data* signal sensed by the selected primary and secondary sense amplifiers, *the data output signal from each bit position corresponding to a data bit in a multi-bit external data output signal.*

6. A random access memory *which is more than one bit wide, the memory* comprising:

an array of memory cells [are] arranged in rows [in] *and* columns, *the array of memory cells being organized into a plurality of bit positions wherein each bit position includes a portion of the array of memory cells*;

a plurality of primary sense amplifiers *for each bit position*, each of said primary sense amplifiers being connected to one of said columns of said array[:], *wherein* said plurality of primary sense amplifiers [being] *within each bit position are* grouped into subsets *of more than one primary sense amplifier*;

a column address decoder, connected to receive a column address word and to drive first and second decode address lines in correspondence with a partial subset of said column address words; and a plurality of secondary sense amplifiers, each of said secondary sense amplifiers having an input connected to [one of said primary sense amplifiers from] *a respective local bus which is coupled to* each *primary sense amplifier of a subset* of said subsets [of said plurality] of primary sense amplifiers, on of said primary sense amplifiers in each of said subsets [of said plurality of primary sense amplifiers] being selectively activated by *coupling the activated primary sense amplifier to the local bus in response to* signals provided on said first decode *address* lines;

said secondary sense amplifiers each being connected to said second decode *address* lines and said secondary amplifiers each providing an output selectively *at each respective bit position* in accordance with signals provided on said second decode *address* lines, *the output from each bit position being simultaneously provided externally of the memory*.

7. A random access memory *which is more than one bit wide, the memory* comprising:

an array of memory cells [are] arranged in rows and columns[:], *the array of memory cells being organized into a plurality of bit positions wherein each bit position includes a portion of the array of memory cells;* a plurality of primary sense amplifiers *for each bit position*, each of said primary [said] *sense* amplifiers being connected to one of said columns of said array and said plurality of primary sense amplifiers *within each bit position* being arranged in subsets *of more than one primary sense amplifier*;

a first [and] *column address decoder and a* second column address [decoders] *decoder,* connected to receive a column address word and to drive first and second address lines, respectively, in correspondence with a partial subset of said column address word; and a plurality of secondary sense amplifiers *for each bit position,* each of said secondary sense amplifiers having an input connected to *a respective local bus which is coupled to* a subset of said primary sense amplifiers, one of said primary sense amplifiers in each of said subsets being selectively activated by *coupling the activated primary sense amplifier to the respective local bus in response to* signals provided on said first address lines;

said secondary sense amplifiers each being connected to said second address [decode] lines and said secondary amplifiers each providing an output selectively in accordance with signals provided on said second address lines, *the output from each bit position being simultaneously provided externally of the memory.*

8. The memory of claim 1 wherein each of the memory cells is an SRAM cell.

9. The memory of claim 6 wherein each of the memory cells is an SRAM cell.

10. The memory of claim 7 wherein each of the memory cells is an SRAM cell.

11. The memory of claim 1 wherein each of the memory cells is a DRAM cell.

12. The memory of claim 6 wherein each of the memory cells is a DRAM cell.

13. The memory of claim 7 wherein each of the memory cells is a DRAM cell.

14. The memory of claim 1 wherein each primary sense amplifier is selectively activated by coupling the primary sense amplifier to a local bus in response to the first decoder output signal.

15. The memory of claim 14 wherein each of the secondary sense amplifiers in each bit position is coupled to the outputs of a corresponding one of the primary sense amplifiers in each subset through the local bus.

16. The memory of claim 15 wherein each primary sense amplifier produces a high impedance output at the local bus when that primary sense amplifier is not selected.

17. The memory of claim 6 wherein each primary sense amplifier produces a high impedance output at the local bus when that primary sense amplifier is not selected.

18. The memory of claim 7 wherein each primary sense amplifier produces a high impedance output at the local bus when that primary sense amplifier is not selected.

19. The memory of claim 16 wherein the high impedance output is produced by a pass transistor, the pass transistor having a current path for coupling the output of the primary sense amplifier to the local bus.

20. The memory of claim 17 wherein the high impedance output is produced by a pass transistor, the pass transistor having a current path for coupling the output of the primary sense amplifier to the local bus.

21. The memory of claim 18 wherein the high impedance output is produced by a pass transistor, the pass transistor having a current path for coupling the output of the primary sense amplifier to the local bus.

22. The memory of claim 15 wherein each secondary sense amplifier includes a three-state output buffer which is in a high impedance condition when the secondary sense amplifier is not activated.

23. The memory of claim 1 wherein primary sense amplifier is activated by applying a signal to the gate of a transistor which is coupled between the primary sense amplifier and a power supply.

24. The memory of claim 6 wherein each primary sense amplifier is activated by applying a signal to the gate of a transistor which is coupled between the primary sense amplifier and a power supply.

25. The memory of claim 7 wherein each primary sense amplifier is activated by applying a signal to the gate of a transistor which is coupled between the primary sense amplifier and a power supply.

26. The memory of claim 23 wherein the primary sense amplifier is selectively activated by applying the first decoder output signal to the gate of a transistor which is coupled between the primary sense amplifier and the local bus.

27. The memory of claim 24 wherein each primary sense amplifier is selectively activated by applying one of the signals provided on the first decode address lines to the gate of a transistor which is coupled between the primary sense amplifier and the local bus.

28. The memory of claim 25 wherein the primary sense amplifier is selectively activated by applying one of the signals provided on the first address lines to the gate of a transistor which is coupled between the primary sense amplifier and the local bus.

29. The memory of claim 26 wherein the primary sense amplifier is selectively activated by simultaneously applying the first decoder output signal to the gate of the transistor which is coupled between the primary sense amplifier and a power supply and to the gate of the transistor which is coupled between the primary sense amplifier and the local bus.

30. The memory of claim 27 wherein the primary sense amplifier is selectively activated by simultaneously applying the one of the signals provided on the first decode address lines to the gate of the transistor which is coupled between the primary sense amplifier and a power supply and to the gate of the transistor which is coupled between the primary sense amplifier and the local bus.

31. The memory of claim 28 wherein the primary sense amplifier is selectively activated by simultaneously applying the one of the signals provided on the first address lines to the gate of the transistor which is coupled between the primary sense amplifier and a power supply and to the gate of the transistor which is coupled between the primary sense amplifier and the local bus.

32. The memory of claim 1 wherein each primary sense amplifier has first and second signal outputs coupled to a local bus which comprises two parallel bus lines and wherein the primary sense amplifier is selectively activated by applying the first decoder output signal to a gate of a first transistor which is coupled between the first signal output of the primary sense amplifier and one of the two parallel bus lines and also applying the first decoder output signal to a gate of a second transistor which is coupled between the second signal output of the primary sense amplifier and the other of the two parallel bus lines.

33. The memory of claim 6 wherein each primary sense amplifier has first and second signal outputs and the local bus comprises two parallel bus lines and wherein the primary sense amplifier is selectively activated by applying one of the signals provided on the first decode address lines to a gate of a first transistor which is coupled between the first signal output of the primary sense amplifier and one of the two parallel bus lines and also applying the same one of the signals provided on the first decode address lines to a gate of a second transistor which is coupled between the second signal output of the primary sense amplifier and the other of the two parallel bus lines.

34. The memory of claim 7 wherein each primary sense amplifier has first and second signal outputs and the local bus comprises two parallel bus lines and wherein the primary sense amplifier is selectively activated by applying one of the signals provided on the first address lines to a gate of a first transistor which is coupled between the first signal output of the primary sense amplifier and one of the two parallel bus lines and also applying the same one of the signals provided on the first address lines to a gate of a second transistor which is coupled between the second signal output of the primary sense amplifier and the other of the two parallel bus lines.

35. The memory of claim 6 wherein each secondary sense amplifier includes a three-state output buffer which is in a high impedance condition when the secondary sense amplifier is not activated.

36. The memory of claim 7 wherein each secondary sense amplifier includes a three-state output buffer which is in a high impedance condition when the secondary sense amplifier is not activated.

37. A wide word random access memory comprising:
   (a) an array of random access memory cells arranged in rows and columns;
   (b) an address decoder for receiving a column address signal, the decoder providing first and second decoder output signals in response to the column address signal;
   (c) a plurality of primary sense amplifiers,
      (1) each of the columns of memory cells being coupled to a respective one of the primary sense amplifiers,
      (2) the primary sense amplifiers being grouped in a plurality of subsets of primary sense amplifiers,
   (d) a plurality of local data buses, each local data bus coupled to an output of each of the primary sense amplifiers in a respective subset,
      (1) wherein one of the primary sense amplifiers in each subset is selectively activated in response to the first decoder output signal, and
      (2) wherein each of the selectively activated primary sense amplifiers is selectively activated by coupling the primary sense amplifier to the local bus in response to the first decoder output signal;
   (e) a plurality of secondary sense amplifiers,
      (1) each secondary sense amplifier having an input connected to the outputs of each of the primary sense amplifiers from a respective one of the subsets,
      (2) each secondary sense amplifier being coupled to the respective primary sense amplifiers through a respective local bus,
      (3) the secondary sense amplifiers being selectively activated in response to the second decoder output signal,
      (4) the plurality of secondary sense amplifiers providing a data output signal in response to a data signal sensed by the selected primary and secondary sense amplifiers;
   (f) wherein the data output signal is one of a plurality of data output signals being outputted externally from the memory.

38. The memory of claim 37 wherein each of the memory cells is a DRAM cell.

39. The memory of claim 38 wherein each primary sense amplifier produces a high impedance output at the local data bus when the primary sense amplifier is not selected.

40. The memory of claim 39 wherein the high impedance output is produced by a pass transistor, the pass transistor having a current path for coupling the output of the primary sense amplifier to the local data bus.

41. The memory of claim 40 wherein each secondary sense amplifier includes a three-state output buffer which is in a high impedance condition when said secondary sense amplifier is not activated.

42. The memory of claim 37 wherein each primary sense amplifier is activated by applying a signal to the gate of a transistor which is coupled between the primary sense amplifier and a power supply.

43. The memory of claim 42 wherein the primary sense amplifier is selectively activated by applying the first decoder output signal to the gate of a transistor which is coupled between the primary sense amplifier and the local bus.

44. The memory of claim 43 wherein the primary sense amplifier is selectively activated by also applying the first decoder output signal to the gate of the transistor which is coupled between the primary sense amplifier and the power supply.

45. The memory of claim 37 wherein each primary sense amplifier has first and second signal outputs and the local bus comprises two parallel bus lines and wherein the primary sense amplifier is selectively activated by applying the first decoder output signal to the gate of a first transistor which is coupled between the first signal output of the primary sense amplifier and one of the two parallel bus lines and also applying the first decoder output signal to the gate of a second transistor which is coupled between the second signal output of the primary sense amplifier and the other of the two parallel bus lines.

46. The memory of claim 37 wherein the address decoder comprises a first address decoder for providing the first output signal and a second address decoder for providing the second output signal.

47. A wide word random access memory arranged in rows and columns of memory cells, comprising:
   a plurality of data terminals, each data terminal for producing an external datum of the wide word;
   a column address decoder circuit for receiving a column address signal and producing a first select signal and a second select signal, the first select signal including address signals from a first group of address bits, the second select signal including address signals from at least another address bit;
   a plurality of secondary sense amplifiers coupled to a respective data terminal, a secondary sense amplifier of the plurality of secondary sense amplifiers coupled to a local data bus for receiving a datum, the secondary sense amplifier selectively coupling the datum to the respective data terminal in response to the second select signal; and
   a plurality of primary sense amplifiers arranged in subsets, each primary sense amplifier of the plurality of primary sense amplifiers coupled to a respective column of memory cells, each subset coupled to an input of a respective secondary sense amplifier, one of the primary sense amplifiers of each subset being selectively activated in response to the first select signal, a selected primary sense amplifier of one of the subsets receiving the datum, the selected primary sense amplifier being selectively activated by applying the datum to the local data bus.

48. A wide word random access memory as in claim 47, wherein the memory cells are dynamic random access memory cells.

49. A wide word random access memory as in claim 48, wherein each of the plurality of primary sense amplifiers that is not selectively activated provides a high impedance output at the local data bus.

50. A wide word random access memory as in claim 49, further comprising a select transistor having a control gate and a current path, the control gate coupled to receive the first select signal, the current path connected between the selectively activated primary sense amplifier and the local data bus.

51. A wide word random access memory as in claim 50, wherein each of the plurality of secondary sense amplifiers that is not selectively coupling the datum provides a high impedance output.

* * * * *